United States Patent [19]
Terada

[11] Patent Number: 5,819,407
[45] Date of Patent: *Oct. 13, 1998

[54] METHOD OF JOINING TOGETHER A PAIR OF MEMBERS EACH HAVING A HIGH THERMAL CONDUCTIVITY

[75] Inventor: Atsushi Terada, Toride, Japan

[73] Assignee: Tousui, Ltd., Totte, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 611,122

[22] Filed: Mar. 5, 1996

[30] Foreign Application Priority Data

| Apr. 19, 1995 | [JP] | Japan | 7-116597 |
| Apr. 20, 1995 | [JP] | Japan | 7-117686 |
| May 16, 1995 | [JP] | Japan | 7-140092 |
| Jul. 5, 1995 | [JP] | Japan | 7-191047 |

[51] Int. Cl.$^6$ ...................................................... B23P 15/00
[52] U.S. Cl. ........................................ 29/890.03; 29/521
[58] Field of Search ............................... 29/890.03, 505, 29/521, 525

[56] References Cited

U.S. PATENT DOCUMENTS

| 4,022,272 | 5/1977 | Miller | 29/890.03 |
| 4,746,479 | 5/1988 | Hanaki et al. | 29/890.03 |
| 5,014,776 | 5/1991 | Hess | 29/890.03 |
| 5,419,041 | 5/1995 | Ozeki | 29/890.03 |
| 5,428,897 | 7/1995 | Jordan et al. | 29/890.03 |
| 5,533,257 | 7/1996 | Romero et al. | 29/890.03 |
| 5,542,176 | 8/1996 | Serizawa et al. | 29/890.03 |
| 5,638,715 | 6/1997 | Lipinski | 29/890.03 |

FOREIGN PATENT DOCUMENTS

| 0 206 980 | 12/1986 | European Pat. Off. . |
| 0 508 497 | 10/1988 | European Pat. Off. . |
| 2 153 864 | 5/1973 | Germany . |
| 25 02 472 | 7/1976 | Germany . |
| 3518310 | 11/1986 | Germany | 29/890.03 |
| 57-196552 | 12/1982 | Japan . |
| 58-192634 | 11/1983 | Japan . |
| 6198383 | 7/1994 | Japan | 29/890.03 |
| 08 293572 | 11/1996 | Japan . |

*Primary Examiner*—Irene Cuda
*Attorney, Agent, or Firm*—Herbert Dubno

[57] ABSTRACT

A method of joining together a pair of members each having a high thermal conductivity includes forming a joining surface of a first of these two members with either of a plurality of projecting portions and a plurality of projecting and recessed portions; forming a joining surface of a second of the extruded members with either a plurality of recessed portions each of which corresponds to a selected one of the projecting portions and a plurality of projecting portions each of which corresponds to a selected one of the recessed portions of the projecting and recessed portions of the first member; and inserting under pressure each of the projecting portions of one of the two extruded members into each of the recessed portions that corresponds thereto, of another of the two extruded members, with a tolerance that is sufficient to induce a plastic deformation in each of the members. Two such members are preferably constituted each by an extruded materials and may constitute a pair of base plates or a pair of fin means and a base plate for a heat sink assembly.

6 Claims, 8 Drawing Sheets

METHOD OF JOINING TOGETHER A PAIR OF MEMBERS EACH HAVING A HIGH THERMAL CONDUCTIVITY

FIELD OF THE INVENTION

The present invention relates to a method of joining together a pair of members of high thermal conductivity as well as a product that is made by a joining method as described. The two members are typically constituted each by an extruded metallic material and the joining method is typically used in assembling a heat sink.

BACKGROUND OF THE INVENTION

Where a pair of members each having a high thermal conductivity, for example, a pair of aluminum members, are to be joined together with their thermal conductivity and electrical conductivity taken into consideration, difficulties have hitherto been encountered because the members have a high capacity for heat radiation and an oxide film can form on the surface of each of these members. Thus, even by means of resistance welding or brazing, it has been found to be more difficult to join aluminum members together than to join a pair of members of other metallic materials together which have rather ordinarily been used materials having a limited thermal conductivity and a reasonable degree of electric resistivity.

In addition, where a pair of extruded members are to be joined together, the size of the product been limited by the size of an extrusion die that can be employed. The extrusion technique is typically unable to produce products wider than 500 mm. If a product with a width greater than 500 mm and having a high thermal conductivity is then to be manufactured, attempts by extrusion have been believed to be useless, say, unless a plurality of smaller products are welded together.

For these reasons, if a product such as a heat sink requires a surface (hereinafter referred to a "base") to which a heat generating element is attached and which exceeds 500 mm in width, there has hitherto been no choice but to give up a production with extruded materials or, alternatively, to join a plurality of bases together by way of welding. Although there has also been a way of fitting a pair of corrugated plates together, such a fitting alone has been found to be insufficient to fully meet the thermal conductivity and electrical conductivity which customarily required for a heat sink.

Also, in preparing a heat sink that utilizes a liquid coolant, a brazing process to affix a pair of plates together is costly. Further, for example, if a die is made by a lost wax process, the die will have to be reformed because two sizes are required.

OBJECT OF THE INVENTION

Accordingly, it is an object of the present invention to resolve the above mentioned deficiencies in the prior art and to provide a method of joining a pair of members each having a high thermal (as well as a high electrical) conductivity in order to yield a product that has an joined interface that is high in both the thermal conductivity and the electrical conductivity.

SUMMARY OF THE INVENTION

In order to achieve this object, there is provided, in accordance with the present invention, in a first aspect thereof, a method of joining together a pair of members each having a high thermal conductivity. The method comprises the steps of: forming a first of the two thermally high conductivity members, at a joining surface thereof, with either a plurality of projecting portions and a plurality of projecting and recessed portions; forming a second of the two members, at a joining surface thereof, with either of a plurality of recessed portions each of which corresponds to a selected one of the projecting portions and a plurality of projecting portions each of which corresponds to a selected one of the recessed portions of the projecting and recessed portions of the first member; and inserting under pressure each of the projecting portions of one of the two members into each of the recessed portions that corresponds thereto, of another of the two thermally high conductivity members, with a tolerance that is sufficient to induce a plastic deformation in each of the members.

The present invention also provides, in a second aspect thereof, a method of joining together a pair of members each having a high thermal conductivity, which method comprises the steps of: forming a first of the two thermally high conductivity members, at a joining surface thereof, with either a plurality of projecting portions and a plurality of projecting and recessed portions; forming a second of the two members, at a joining surface thereof, with a plurality of recessed portions each of which corresponds to a selected one of the projecting portions and/or a plurality of projecting portions each of which corresponds to a selected one of the recessed portions of the projecting and recessed of the Said first member; providing each of at least some of the projecting portions and the recessed portions with a portion which is inclined with a given angle; inserting under pressure each of the projecting portions of one of the two members into each of the recessed portions that corresponds thereto, of another of the two members; in a stage in which the projecting portions are inserted under pressure into the corresponding recessed portions, dynamically affecting areas of the at least some of the projecting portions and the said recessed portions with such portions each as inclined with the given angle, thereby plastically deforming the areas; and, as a result of the plastic deformation of the areas, effecting a work hardening thereof so as to enhance a tightness of fastening between the said two thermally high conductivity members.

The present invention further provides, in a third aspect thereof, a method of joining together a pair of members each having a high thermal conductivity, which method comprises the steps of: forming a first of the two thermally high conductivity members, at a joining surface thereof, with either a plurality of projecting portions or a plurality of projecting and recessed portions; forming a second of the two members, at a joining surface thereof, with a plurality of recessed portions each of which corresponds to a selected one of the projecting portions, or a plurality of projecting portions each of which corresponds to a selected one of the recessed portions of the said projecting and recessed portions of the first member; providing each of at least some of the projecting portions and said recessed portions with a portion that is inclined with a given angle; inserting under pressure each of the said projecting portions of one of the two members into each of the recessed portions that corresponds thereto, of another of the two members, with a tolerance that is sufficient to induce a plastic deformation in each of the members; in a stage in which the said projecting portions are inserted under pressure into the said corresponding recessed portions, dynamically affecting areas of at least some of the projecting portions and the said recessed portions with such portions each as inclined with the given angle, thereby plastically deforming the areas; and, as a result of the plastic deformation of the areas, effecting a work hardening thereof so as to enhance a tightness of fastening between the said two thermally high conductivity members.

It should be noted at this point that the two members to be joined together according to the present invention can typically or preferably be each constituted by an extruded material.

According to a concomitant feature of the present invention, the members are each made up from a metallic material. The method can further comprise the steps of: providing each of at least some of the said projecting portions and the recessed portions, which correspond to the recessed portions and the projecting portions in joining, with a portion that is inclined with a given angle. In a stage in which the projecting portions are inserted under pressure into the said corresponding recessed portions, a frictional action and a caulking action is developed between each pair of at least some of the entering metallic projecting portions and at least some of the receiving metallic recessed portions which correspond thereto, developing an internal stress from a contraction and an expansion of each of the entering metallic projecting portions and each of the receiving metallic recessed portions, respectively, under said pressure. The entering projecting portions and the receiving recessed portions are thus joined together under a combined effect of the frictional and caulking actions and the internal stress under the pressure.

According to another concomitant feature of the present invention, the pair of thermally high conductivity members are each constituted by a base plate for a heat sink assembly.

According to a further concomitant feature of the present invention the method of joining is characterized in the two thermally conductivity members are constituted by a base plate and fin means, respectively, for a heat sink assembly.

The present invention still further covers a product that is made according to a method of joining a pair of members each having a high thermal conductivity.

Thus, in joining together a pair of members each having a high thermal conductivity (as well as a high electrical conductivity), by virtue of the fact that a first of the two thermally high conductivity members to be joined together is formed on a joining surface thereof with either of a plurality of projecting portions and a plurality of projecting and recessed portions; a second of the extruded members is formed on a joining surface thereof with either of a recessed portion that corresponds to a selected one of the projecting portions and a projecting portion that corresponds to a selected one of the recessed portions first member and each of the projecting portions of one of the two members is inserted under pressure into a respective recessed portion that corresponds thereto, of other of the two extruded members, with a tolerance that is sufficient to induce a plastic deformation in each of the member, an enhanced tightness of fastening between the two thermally high conductivity members together is attained.

Also, in joining a pair of such members together, by virtue of the fact that each of at least some of the projecting portions and the recessed portions is provided with a portion that is inclined with a given angle, in a stage in which the said projecting portions are inserted under pressure into the said corresponding recessed portions, areas of the said at least some of the said projecting portions and the said recessed portions are dynamically affected by the provision of such portions each as inclined with the said given angle and are thereby plastically deformed. As a result of the plastic deforming of such areas, a work hardening thereof is effected, a further enhanced tightness of fastening between the two thermally high conductivity members is achieved.

Also, in joining a pair of such members together, by virtue of the fact that each of at least some of the projecting portions and the recessed portions correspond to the recessed portions and the projecting portions in joining, are provided with a portion that is inclined with a given angle, and in a stage in which the said projecting portions are inserted under pressure into the said corresponding recessed portions, a frictional action and a caulking action are produced between each pair of at least some of the entering metallic projecting portions and at least some of the said receiving metallic recessed portions which correspond thereto, and an internal stress is also produced from a contraction and an expansion of each of the said entering metallic projecting portions, the said entering projecting portions and the said reception recessed portions are tightly joined together under a combined effect of the said frictional and the caulking action and the said internal stress, thereby enhancing both the thermal conductivity and the electrical conductivity at the joining interface of the two thermally high conductivity members.

The present invention also provides, in a further aspect thereof, a method of assembling a heat sink, where a base plate and a plurality of fin means disposed over the base plate are assembled together by inserting the fin means fittedly into the base plate. The method comprises the steps of: forming at least either of the fin means and the base plate with a plurality of projecting portions at a plurality of locations, respectively, at which the fin means and the base plate are to be fastened together, with the said plurality of projecting portions, if formed over the said fin means, being adapted to be inserted fittedly into the base plate and the plurality of projecting portions, if formed over the base plate, being adapted to be inserted fittedly into the fin means. Each of the said plurality of projecting portions is arranged so as to be spaced apart from one another with a predetermined distanced. The plurality of projecting portions, if formed over the fin means, fittedly into the said base plate and the plurality of projecting portion, if formed over the base plate, is inserted under pressure fittedly into the fin means, thereby fastening the plurality of fin means and the base plate together.

The present invention also provides, in a still further aspect thereof, a heat sink in which a base plate and a plurality of fin means disposed over the base plate are assembled together by inserting the fin means fittedly into the base plate. The heat sink is characterized in that a plurality of projecting portions are formed over at least either of the said fin means and the said base plate at a plurality of locations, respectively, at which the fin means and the base plate are to be fastened together, with each of the plurality of projecting portions being arranged so as to be spaced apart from one another with a predetermined distance; and that under pressure, the plurality of projecting portions if formed over the fin means are fittedly inserted into the said base plate whereas the plurality of projecting portions if formed over the said base plate are fittedly inserted into the said fin means so that the plurality of fin means and the base plate may be fastened together.

Also, a heat sink according to the present invention may further be characterized in that in at least either of the fin means and the base plate, the projecting portions are provided with a first positioning portion and a first caulking portion. At least one of the positioning portion and the caulking portion is inclined with a given angle. A stress and a drag are produced by the said angle when under pressure, and are used to further enhance the tightness of fastening between the said fin means and the said base plate.

By virtue of the fact that a plurality of projecting portions are formed over at least either of the said fin means and the said base plate at a plurality of locations, respectively, at which the said plurality of fin means and the said base plate are to be fastened together, with each of the said plurality of projecting portions being arranged so as to be spaced apart from one another with a predetermined distance and that under pressure, each of the said plurality of projecting portions is formed over said fin means and the said base plate is fittedly inserted into a corresponding recess formed between the adjacent two of the said projecting portions in the said base plate and in the said fin means and having a width that is smaller than that of each of the said projecting portions, the said projecting portions over the said fin means and the said projecting portions over the said base plate will be allowed to be fastened together and assembled, thereby increasing the tightness between the said fin means and the said base plate while enhancing thermal conductivity between them.

BRIEF DESCRIPTION OF THE DRAWINGS

The present invention will better be understood from the following detailed description and the drawing attached hereto showing certain illustrative embodiments of the present invention. In this connection, it should be noted that such embodiments as are illustrated in the accompanying drawing are intended in no way to limit the present invention, but to facilitate an explanation and understanding thereof.

In the accompanying drawings.

SPECIFIC DESCRIPTION

With respect to certain exemplary embodiments of the present invention that may be constituted as mentioned comprehensively above, an explanation will now be given in detail with reference to the accompanying drawings.

Figure 1:
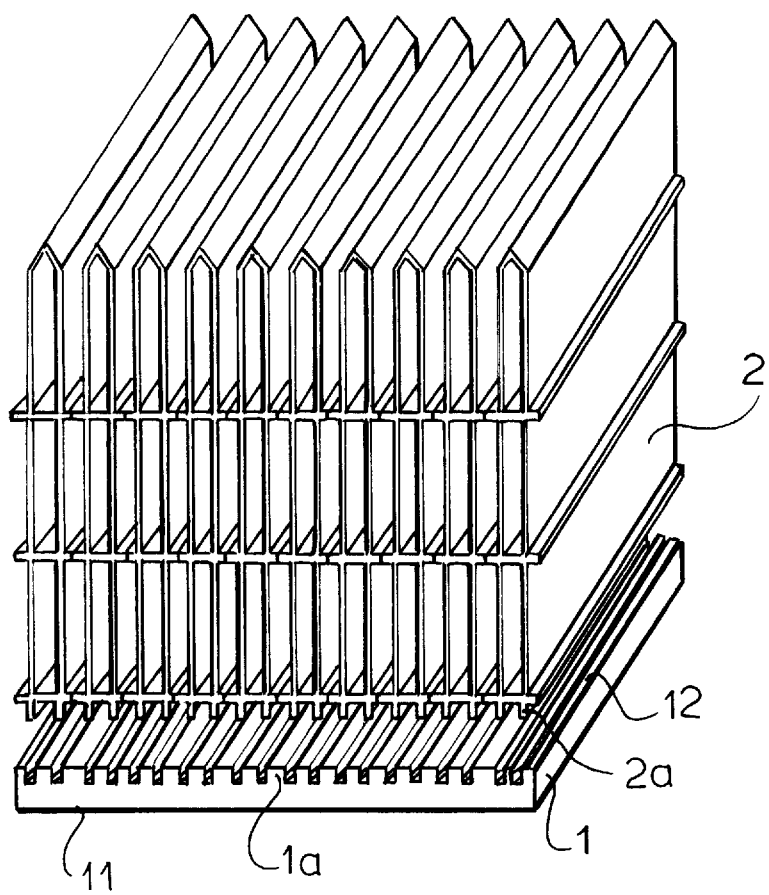
FIG. 1 is a perspective view diagrammatically illustrating an embodiment to which the present invention has been applied to form a heat sink assembly.
Figure 2:
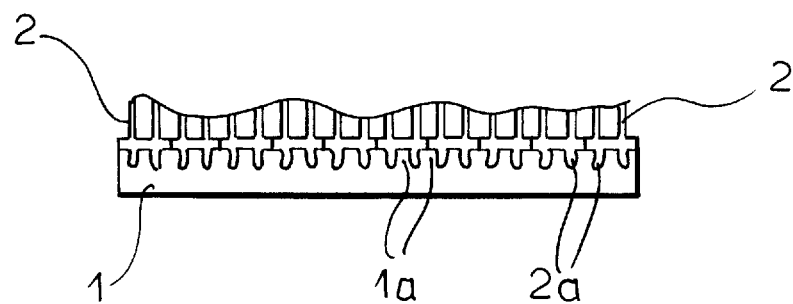
FIG. 2 is a partial front view of the entire heat sink assembly shown in FIG. 1, diagrammatically illustrating a state in which fin means and a base plate have been joined together according to the present invention.
Figure 3:
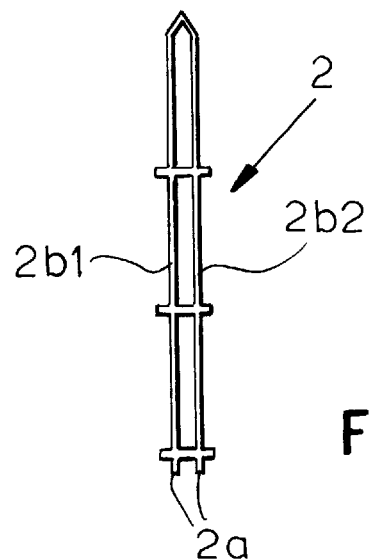
FIG. 3 is an enlarged front view diagrammatically illustrating a single fin unit in a heat sink assembly as shown in FIG. 1.
Figure 4:
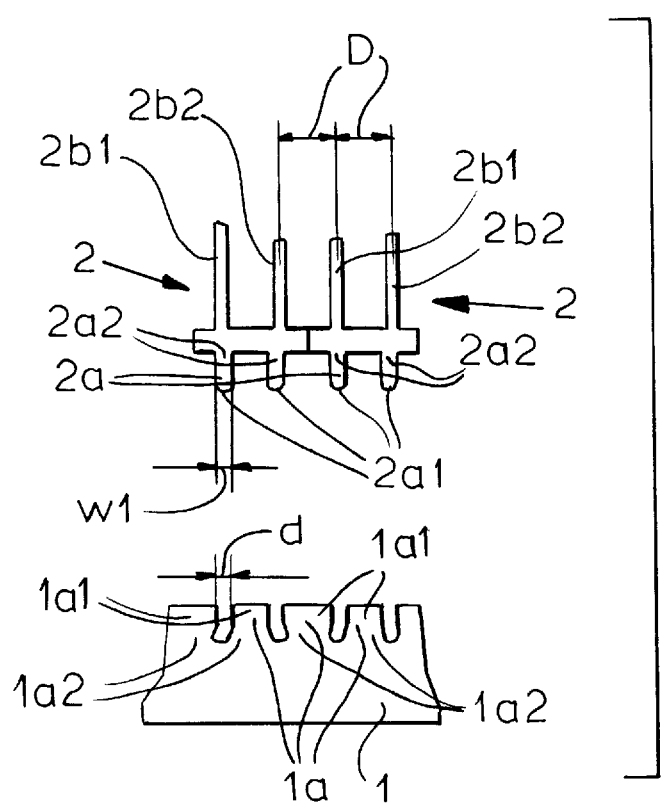
FIG. 4 is an enlarged front view diagrammatically illustrating portions at which fin means and a base plate are to be joined together according to the present invention.

Referring now to FIGS. 1 to 4 numeral 1 represents a base plate 1 has a surface 11 to which a heat generating element (not shown) is attached. Fin means 2 is joined to a surface 12 which is opposite to the attachment surface 11 for the heat generating element of the base plate 1. The base plate 1 and the fin means 2 are, here, each constructed of an extruded member that is composed of a material of high thermal conductivity such as, for example, aluminum. The fin means 2, as shown in FIG. 3, is constructed as having, at one end thereof, a plurality of projecting portions 2a which constitute fastening portions for joining the fin means 2 to the base plate 1 and as having side plates 2b1 and 2b2 with which small compartments are formed so as to form a radiation fin unit. The side plates 2b1 and 2b2 are shown as having an interspacing D (FIG. 4). The fin assembly is constituted by a plurality of fin means 2 which are to be joined to the base plate 1 in order to acquire a predetermined heat radiating property for a heat sink.

As shown in FIG. 4, each projecting portion 2a at the end of each fin means 2 which extends in a vertical direction is constructed to have a predetermined width w1 and is formed at its front end with a positioning portion 2a1 and at its root side with a caulking portion 2a2. On the other hand, the base plate 1 is formed with a plurality of projecting portions 1a each of which is formed with its forward end with a positioning portion 1a1 and at its root side with a caulking portion 1a2, with the caulking portion 1a2 being inclined with an angle relative to a vertical direction. The positioning portion 2a1 is formed to have a rounded forward end whereas a recessed portion between two adjacent projecting portions 1a of the base plate 1 is formed to have a rounded bottom. Also, the width w1 of each projecting portion 2a of the fin means 2 is made identical to, or slightly larger than, a spacing or the width d of the recessed portion between two adjacent projection portions 1a of the base plate 1. Furthermore, the spacing between two adjacent projecting portions 2a of the fin means 2 is made identical to, or slightly smaller than the width of each projecting portion 1a of the base plate 1.

In order that a pressure applied downwardly from the fin means 2 or applied upwardly from the base plate 1 may, when they are fastened together, be converted to a force of fastening between the fin means 2 and the base plate 1 with certainty, the positioning portions 1a1 of the base plate 1 and the positioning portions 2a1 of the fin means 2, when the fin means 2 and the base plate 1 are fittedly inserted into each other, have a role for retaining their verticality.

Figure 5:
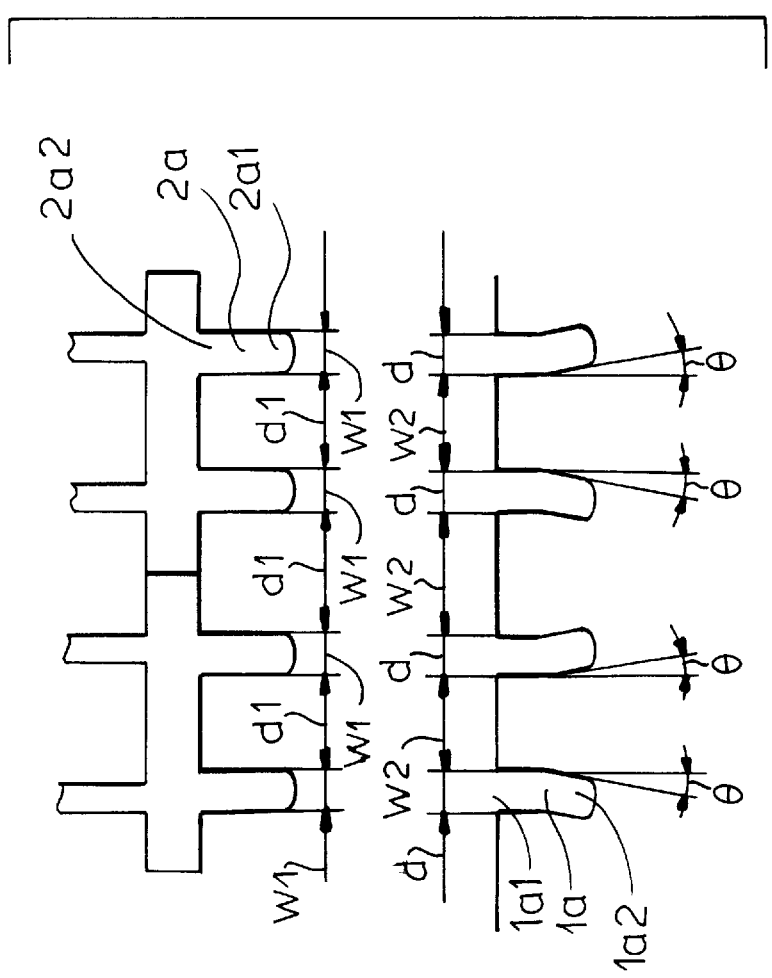
FIG. 5 is an enlarged front view diagrammatically illustrating in some detail a certain form with which fin means and a base plate are to be joined together according to the present invention.

FIG. 5 shows a recessed portion 1a formed between two adjacent projecting portions of the base plate 1 and having the width d. Furthermore, the interspacing between two adjacent projecting portions 2a of the fin means 2 is shown as having a width d1 whereas a projecting portion between two adjacent recessed portions 1a of the base plate 1 is shown as having a width w2. In addition, the aforementioned angle, here, at the caulking portion 1a2 of each recessed portion 1a of the base plate 1 is shown by θ, each recessed portion 1a having a positioning portion 1a. Note also that two adjacent recessed portions are shown as being inclined (with the angle θ) in opposite directions at their caulking portions mentioned above.

Prior to the assembling, the surface of fin means 2 and the surface of the base plate 1, which are typically each made up of an extruded aluminum material, will have been oxidized to have an oxide film of some degree of thickness formed thereon.

In the stage of assembling, by utilizing, for example, a general purpose hydraulic press or the like and a simple jig in a combination, the projecting portions 2a at the front end of each fin means 2 are inserted into recessed portions 1a between the individual projecting portions of the base plate 1 under a pressure amounting to several tens tons that is applied in a short period of time.

At the time of pressure-inserting the fin means 2 into the base plate 1, since the width d of each recessed portion 1a of the base plate 1 is made identical to, or slightly smaller than, the width w1 of each projecting portion 2a of the fin means 2, the interspacing d1 between two adjacent projecting portions 2a of the fin means 2 is made identical to, or slightly smaller than, the width w2 of each projecting portion between two adjacent recessed portions 1a of the base plate 1, the positioning portion 2a1 of each projecting portion 2a is formed to have a rounded forward end and each recessed portion 1a is formed to have a rounded bottom, it can be seen that if a large pushing pressure is applied downwardly from the fin means 2, the positioning portion 2a1 of each of the projecting portions 2a of the fin means 2 will first be introduced into the positioning portion 1a1 of each of the recessed portions 1a of the base plate 1 and will then be introduced into the caulking portions 1a2 of each recessed portion 1a of the base plate 1. At this time, since the caulking portions 1a2 of the recessed portions 1a of the base plate 1 are each inclined with the slight angle θ relative to the vertical direction, it can be seen that the positioning portion 2a1 of each projecting portion 2a of the fin means 2 which is introduced into a corresponding recessed portion 1a of the base plate 1 will be inserted fittedly into the caulking portions 1a2 of the recessed portions 1a of the base plate 1 while being bent in conformance to the inclination of these caulking portions 1a2.

At this time, since the width w1 of each of the projecting portions 2a and the width w2 of each of the projecting portions 1a are made identical to, or slightly larger than, the spacing d between the adjacent two projecting portions 1a and the spacing D between the adjacent two projecting portions 2a, respectively, it should be noted that a phenomenon called "dragging" will be generated between the respective external surfaces of the projecting portions 1a and 2a.

More specifically, with the external surface of each of the projecting portions 2a of the fin means 2 and the internal surface of each of the recessed portions 1a of the base plate 1 being in contact with each other, it can be seen that a force of friction will be generated between these surfaces and, for the reason of this frictional force, the oxide film that has been formed on each of the respective external surfaces of the projecting portions 1a and the oxide film that has been formed on each of the respective internal surfaces of the recessed portions 2a will be scraped away from each other and a dragging action will take place. As a result, an extremely intimate joining state will be established between each of the respective positioning portions 2a1 of the projecting portions 2a and a corresponding one of the respective caulking portions 1a2 of the recessed portions 1a on the one hand and between each of the respective positioning portions 1a1 of the recessed portions 1a and a corresponding one of the respective caulking portions 2a2 of the projecting portions on the other hand. Accordingly, with the projecting portions 2a and the corresponding recessed portions 1a being intimately joined, it can been seen that both the thermal conductivity and the electrical conductivity between the fin means 2 and the base plate 1 will be extremely enhanced.

It should also be noted that each portion of joining between the fin means 2 and the base plate 1 which are pressure inserted into each other will give rise to a stress in their contacting horizontal direction due to the pressure applied in the vertical direction, hence yielding their fastening result with a greater certainty.

Since the positioning portion 2a1 of each projecting portions 2a, when pressure inserted, is forcibly bent with the angle θ of the caulking portion 2a2 of the corresponding recessed portion relative to the vertical direction, it should also be noted that a work-hardening effect will be produced there, thereby giving rise to the fastening result with a greater certainty.

Thus, a heat that is generated from a heat generating element will be transferred from the base plate 1 via the joining surface established between the fin means 2 and the base plate 1 as mentioned above to the fin means 2. The fin means 2 will then act to take away the heat transferred from the base plate 1 by virtue of an air flow from a fan (not shown) that is attached to the heat sink assembly.

While there is no problem with respect to the joining due to the dragging action between the fin means 2 and the base plate 1 if it is effected as mentioned above, it should be noted that in a case where the fin means 2 and the base plate 1 are each constructed of an extruded material, it differs from a cut material and includes a distortion therein that has be produced in an extrusion operation. Then, the fin means 2 and the base plate 1 might not be joined owing to the "dragging" action alone with stability. Even in such a case, it should be noted that a work hardening effect will here take place based on a plastic deformation at a forcibly bent portion (i.e. the forward end of a positioning portion 2a1) when the fin means 2 and the base plate 1 are joined together and will affect a force of joining the fin means 2 to the base plate 1 together. Note here that the force of joining between the fin means 2 and the base plate 1 is directly related to a thermal conductivity at the interface between them. More specifically, this portion has a role to compensate for an inconsistency in the performance of a heat sink that results from an inconsistency in size of products. It should also be noted that even in a case where the oxide film that is produced on the external surface of each of the projecting portions is thick, thus making it impossible to develop a full dragging state, a stress at the joining surface that is produced by the pressure applied there will be capable of enhancing the thermal conductivity there.

Also, it should be noted that while the fin means 2 and the base plate 1 is brought into a joining state under the dragging action at the portions of the projecting portions when pressure inserted, it is also possible to carry out a preliminary step to remove an oxide film at a portion to be joined, that is, upon the external surface of each of the projecting portions by using a wire brush or the like prior to the pressure insertion. Thus, while the present invention enables an oxide film upon the external surface of each of the projecting portions an an oxide film upon the internal surface of each of the recessed portions to be removed by the dragging action and hence essentially makes it unnecessary to employ the above mentioned preliminary step, thus having the effects of simplifying the method of assembling and lowering the manufacturing cost, it is still possible to incorporate the above mentioned preliminary step in a case where the scraping of the oxide film by way of the dragging action can only be performed insufficiently.

It should further be noted that whilst in an example as mentioned above, the positioning portion of each projecting portion is formed to have a rounded forward end, such an end configuration is not an absolute limitation but it may, for example, be wedge shaped.

Figure 6:
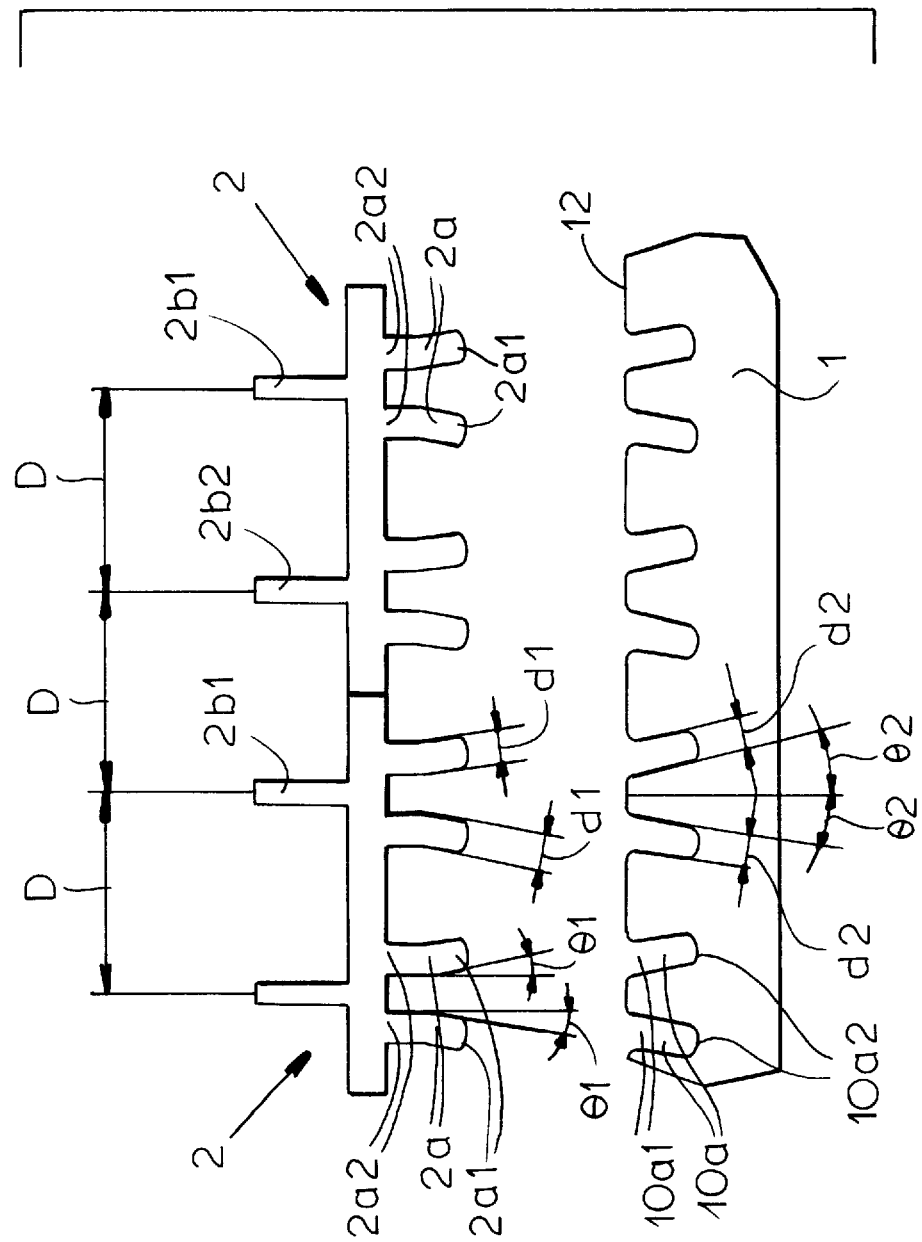
FIG. 6 is an enlarged front view diagrammatically illustrating in some detail another form with which fin means and a base plate are to be joined together according to the present invention.

Next, FIG. 6 shows a modified embodiment of a section where the fin means 2 and the base plate 1 are to be joined together to constitute a heat sink according to the present invention.

In this embodiment, a projecting portion 2a at the front end of each fin means 2 is formed to have a predetermined width d1 and is constructed with a forward end portion 2a1 and a root end portion 2a2. It is seen that the root end portion 2a2 is formed to extend in a vertical direction and the forward end portion 2a1 is formed so as to be inclined with a small angle θ 1 relative to the vertical direction. It is seen that the forward end portion 2a1 is formed to have a rounded forward end.

On the other hand, the attachment surface 12 of the base plate 1 is formed with such a plurality of recessed portions 10a as corresponding to a plurality of projecting portions 2a of the fin means 2. Such a recessed portion 10a is formed to have a width d2 that is slightly smaller than the width d1 of each projecting portion 2a and to linearly extend in a direction that is inclined with an angle θ 2 with respect to the vertical direction. It is seen that the angle θ 2 is set to be greater than the angle θ 1. It is also seen that the recessed portion 10a has a depth that corresponds to the length of the projecting portion 2a, and has a bottom which conforms to the configuration of the forward end of the projecting portion 2a.

In the stage of assembling, by utilizing, for example, a general purpose hydraulic press or the like and a simple jig in a combination, portions of the projecting portions 2a of each fin means 2 are fittedly inserted into the corresponding recessed portions 10a of the base plate 1, respectively, under a pressure amounting to several tens tons that is applied in a short period of time.

At the time of pressure-inserting the fin means 2 into the base plate 1, since the width d1 of each of the projecting portions 2a of the fin means 2 is made slightly larger than the width d2 of each recessed portion 10a of the base plate 1 and the forward end portion 2a1 of each projecting portion 20a is formed to have a rounded forward end while the corresponding recessed portion 10a is formed to have a rounded bottom complementary thereto, it can be seen that if a large pushing pressure is applied downwardly from the fin means 2, the forward end portion 2a1 of each of the projecting portion 2a of the fin means 2 will be introduced into a corresponding recessed portion 10a of the base plate 1. At this time, since the recessed portions 10a are each inclined with the angle θ 2 relative to the vertical direction, it can be seen that the forward end portion 2a1 and the root end portion 2a2 of each projecting portion 2a of the fin means 2 which is introduced into a corresponding recessed portion 10a of the base plate 1 will be inserted fittedly into the recessed portion 10a while being bent in conformance to the angle of inclination θ 2 thereof.

At this time, since the width d1 of each of the projecting portions 2a is made greater than the width d2 of each of the recessed portions 10a, it should be noted that a phenomenon called "dragging" will be generated between the external surface of each of the projecting portions 2a and the internal surface of each of the recessed portions 10a. More specifically, with the external surface of each of projecting portions 2a of the fin means 2 and the internal surface of each of the recessed portions 10a of the base plate 1 being in contact with each other, it can be seen that a force of friction will be generated between these surfaces and, for the reason of this frictional force, the oxide film that has been formed on each of the respective external surfaces of the projecting portions 2a and the internal surface of each of the recessed portions 10a will be scraped away and the dragging will take place. As a result, an extremely intimate joining state will be established between these surfaces. Accordingly, with the projecting portions 2a and the recessed portions 10a being intimately joined, it can been seen that both the thermal conductivity and the electrical conductivity between the fin means 2 and the base plate 1 will be extremely enhanced.

It should also be noted that each portion of joining between the fin means 2 and the base plate 1 which are pressure inserted into each other will give rise to a stress in their contacting horizontal direction due to the pressure applied in the vertical direction, hence yielding their fastening result with a greater certainty.

Since the forward end portion 2a1 of each of the projecting portions 2a of the fin means, when pressure inserted, is forcively bent with the angle θ 2 of each recessed portion 10a of the base plate 1 relative to the vertical direction, it should also be noted that a work-hardening effect will be produced there, thereby giving rise to the fastening result with a greater certainty.

It should be noted that in the embodiment shown in FIG. 6, while the projecting portions 2a are formed on the side of the fin means 2 and the recessed portions 10a are formed at the side of the base plate 1, it is also possible to form the recessed portions at the side of the fin means 2 and the projecting portions on the side of the base plate 1.

It should further be noted that in the various embodiments set forth in the foregoing, the configuration and the number of the projecting portions and the recessed portions can suitably be altered depending upon the magnitude of the pressure that is applied when the fin means 2 and the base plate 1 are pressure inserted into each other.

According to a method of assembling a heat sink that is provided in accordance with the present invention, it will now become apparent that neither a brazing facility nor any expensive dedicated machine for the purpose of caulking is required and a heat sink can readily be manufactured with a combination of a general purpose press or the like and a simple jig.

Also, according to a heat sink that is provided in accordance with the present invention, it will now become apparent that its thermal conductivity is sharply enhanced by the intensive action of rubbing a pair of the joining surfaces of the base plate and the fin means together which action is generated when they are fittedly inserted into each other and which acts to scrape away the oxide films previously formed thereon and thereby to refresh these joining surfaces and by rendering the refreshed surfaces in a joining state by way of dragging.

Also, with an extrusion technique and a step of heat treatment as required taken into consideration, in a variety of preliminarily varied situations including a case where fully refreshed surfaces may not be realized because of the thickness of such an oxide film and a case where the precision of the extrusion required is varied more or less, it will now become apparent that the present invention enables the fin means and the base plate to be firmly fastened with a greater certainty.

Figure 7A:
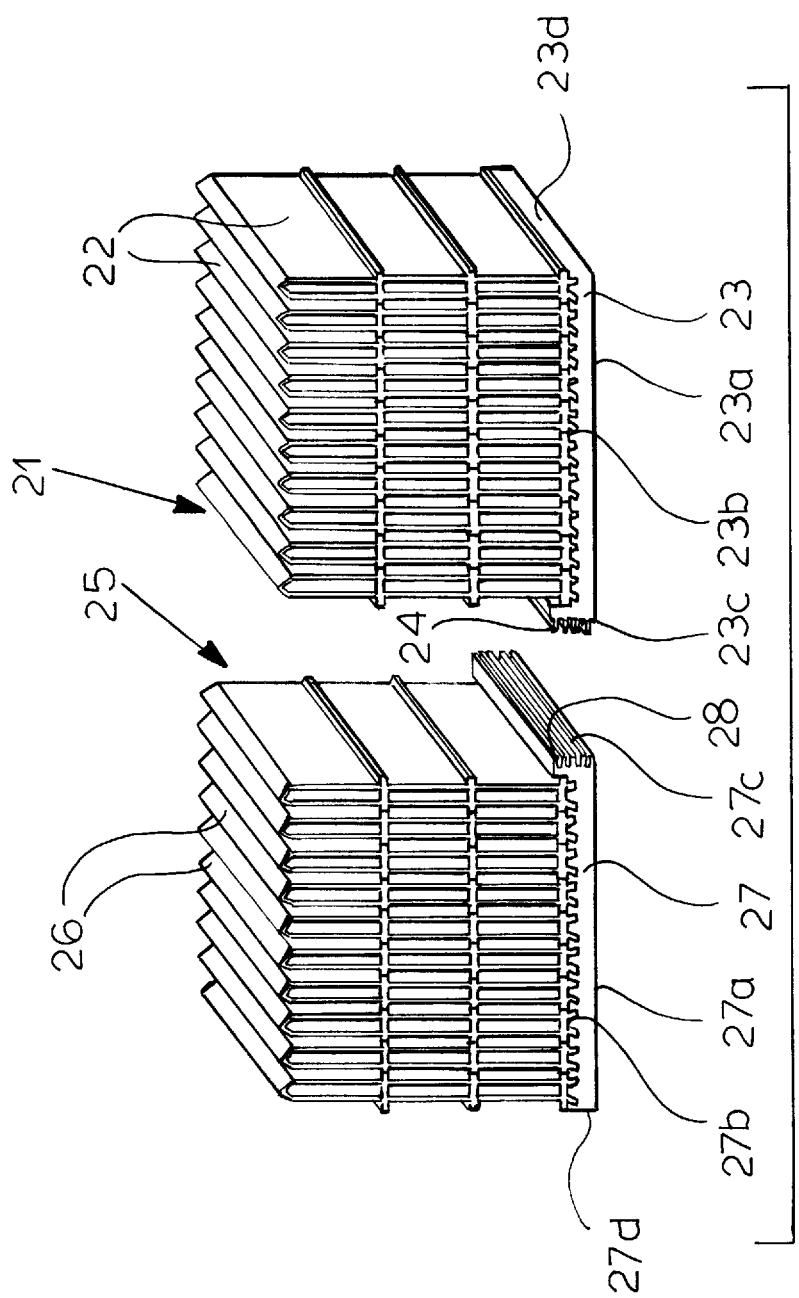
FIG. 7(A) is a perspective view diagrammatically illustrating a heat sink assembly comprising a pair of heat sink units of which the respective base plates are to be joined together and in each of which fin means and a base plate have been joined together, according to the present invention.
Figure 7B:
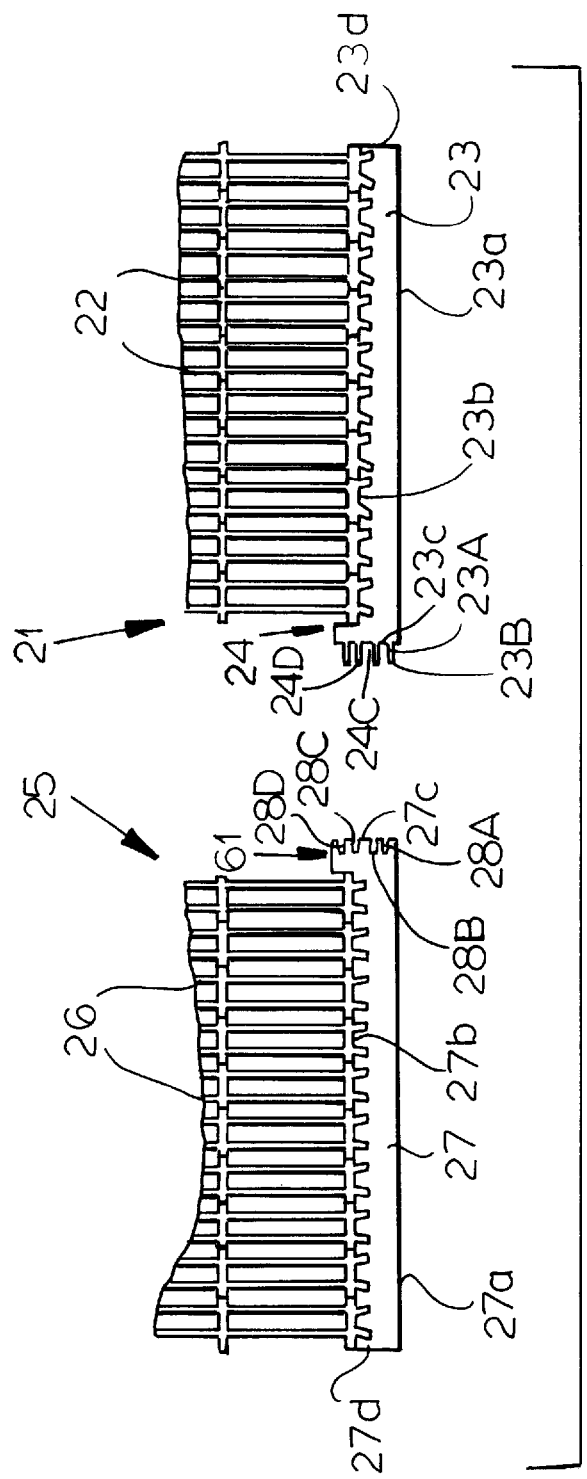
FIG. 7(B) is an enlarged front view diagrammatically illustrating an enlarged front view of the state of the heat sink assembly shown in FIG. 7(A)
Figure 7C:
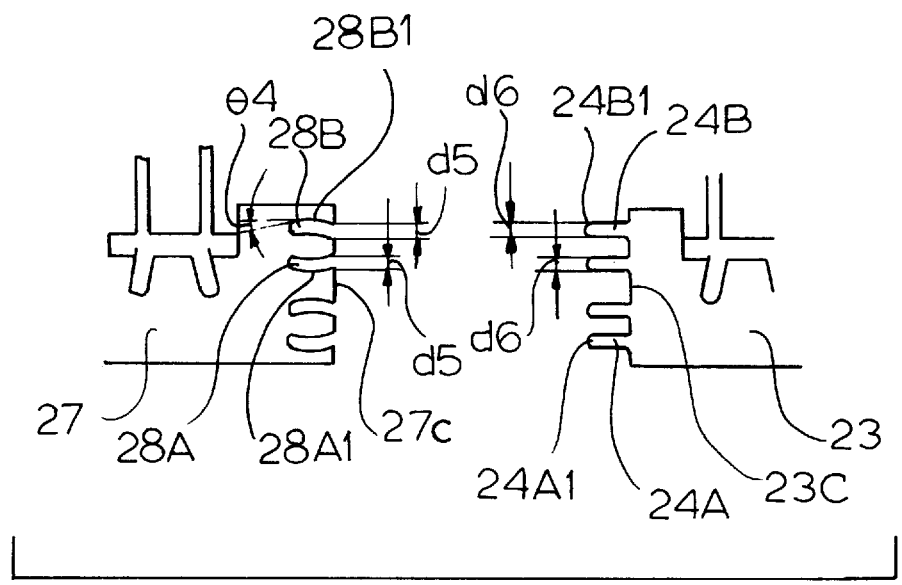
FIG. 7(C) is a further enlarged diagrammatic view illustrating a pair of base plates for a heat sink assembly as shown in FIG. 7(A), which are being joined together according to the present invention.
Figure 7D:
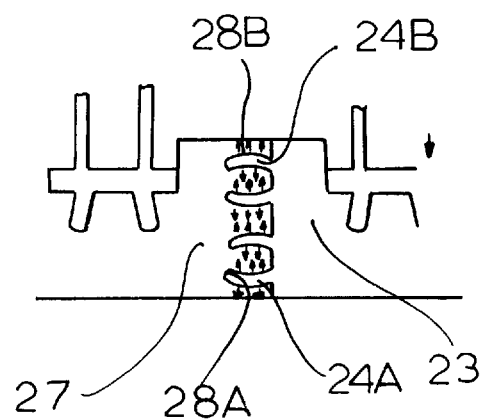
FIG. 7(D) is a similar view diagrammatically illustrating those base plates which have been joined according to the present invention.

Referring now to FIGS. 7(A), 7(B) and 7(C), it will be seen that numeral 22 represents a heat sink that is constituted by a base plate 23 having a surface 23a to which a heat generating element (not shown) is attached; and a plurality of fin means 22 which are attached to a surface 23b that is opposite to the heat generating element attachment surface 23a and which have surfaces on which the heat from the heat generating element is cooled by a coolant air flow or the like passing in contact with these surfaces. The fin means 22 and the base plate 23 have been joined together through the joining surface 23b as mentioned previously in accordance with the present invention. Numeral 25 represents another heat sink that is similar to the heat sink 21 and that is constituted by a base plate 27 having a surface 27a to which a heat generating element (not shown) is attached; and a plurality of fin means 26 which are attached to a surface 27b that is opposite to the heat generating element attachment surface 27a and which have surfaces on which the heat from the heat generating element is cooled by a coolant air flow or the like passing in contact with these surfaces. The fin means 26 and the base plate 27 have been joined together through the joining surface 27b as mentioned previously in accordance with the present invention. Each of the respective constituent parts of the heat sinks 21 and 25, i.e., the fin means 22 and 26 and the base plates 23 and 25, is, here, typically constructed by an extruded member composed of a material that is of a high thermal conductivity, for example, an aluminum material.

One side surface 23c of the base plate 23 of the heat sink 21 is formed to have a width that is greater than that of an opposite side surface 23d of the portion on which the fin means 22 are upstanding, and is formed with a plurality of (here four in number, for example) projecting portions 24. On the other hand, one side surface 77c of the base plate 27 is formed to have a width that is greater than that of an opposite of the portion on which the fin means 26 are upstanding, and is formed with a plurality of (here four in number, for example) recessed portions 28 which correspond in number to the projections 24 of the base plate 23. Thus, the projecting portions 24 of the base plate 23 are adapted to be inserted under pressure into the corresponding recessed portions 28 so that the base plates 23 and 27 may be joined together at the respective sets of the projecting portions 24 and the recessed portions 28 with the side surfaces 23a and 27c as a pair of joining surfaces.

Each of the projecting portions 24A, 24B, 24C and 24D of the base plate 23 is formed to have a rounded forward end and to extend in a direction perpendicular to the joining surface 23c and is formed to have a width d6 that is slightly greater than a width d5 of each of the recessed portions 28A, 28B, 28C and 28D. On the other hand, the recessed portion 28A of the base plate 27 is formed with an internal surface 28A1 that is bent to have a given angle of inclination θ 4 with respect to a direction which is perpendicular to the joining surface 27c whereas the recessed portion 28B is formed with an internal surface 28B1 that is bent to the opposite side to that of the bent portion 8A1 of the recessed portion 28A to have the given angle of inclination θ 4 which is perpendicular to the joining surface 27c. The recessed portions 28A and 28B are shown to have symmetrical arcuate configurations and as being inclined to be opposite to each other. The recessed portions 28C and 28D are formed to have their configurations which are the same as those of the recessed portions 28A and 28B, respectively, which are mentioned above.

An explanation will next be given with respect to a method of preparing a pair of heat sinks which should preferably be composed of extruded metallic materials.

In the heat sinks 21 and 25 constructed as mentioned above, if the projecting portions 24 of the base plate 23 of the heat sink 21 are pressure inserted into the corresponding recessed portions 28 of the base plate 27 of the heat sink 25, respectively, under a pressure amounting to several tens tons that is applied in a short period of time by utilizing a general purpose hydraulic press or the like and a simple jig in a combination, each of the projecting portions 24 will fittedly be inserted into each of the corresponding recessed portions 28 with the forward end of the former rendered to conform in the angle θ 4 to the inside of the latter at the inclined portion.

Withe respect to the state in which the projecting portions 24 are inserted under pressure into the recessed portions 28, a detailed explanation will now be given by taking the projecting portion 24A and the recessed portion 28A as an example.

First of all, it should be noted that prior to the fitted insertion, the external surface of the projecting portion 24A and the internal surface of the recessed portion 28A, as a result of having contacted to the ambient air, has an oxide film formed on each of the surfaces, the oxide film having some degree of thickness.

Next, in the stage of pressure insertion in which the projecting portion 24A is first introduced from the rounded portion at its forward end into the recessed portion 28A, the projecting portion 24A will due to its size tolerance with the recessed portion 28A will suffer a plastic deformation, will thereby be subjected to a work hardening and will thus be hardened.

At this time, since the projecting portion 24A is forcibly inserted into the inclined internal surface portion 28A1 with the angle θ 4, the hardened portion will act to exert a spring force thereto, thus enhancing the tightness of fastening between the projecting portion 24A and the recessed portion 28A.

In connection with the above, it should also be noted that since the extruded members tend to be inconsistent in their tolerance, there may arise a situation in which the work hardening occurs first at the inclined surface portion 28A1 of the recessed portion 28A and an internal stress (i.e., the spring force) then develops within this inclined surface portion.

Also, since the projecting portion 24A is formed to have its width d6 that is slightly greater than the width d5 of the recessed portion 28A and, in other words, since the volume V1 of the projecting portion 24A is made slightly greater than the volume V2 of the recessed portion 28A, it should be noted that there develops a phenomenon that is called "dragging" between the external surface of the projecting portion 24A and the internal surface of the recessed portion 28A.

More specifically, it should be noted that a force of friction will then develop between a boundary portion interfacing the rounded portion of the projecting portion 24A and an external surface thereof perpendicular to the joining surface 23c and the bent internal surface 28A1 of the recessed portion 28 so that the oxide film on the projecting portion 24A having the width d6 and the oxide film on the internal surface of the recessed portion 28A may be scraped away from each other. In addition, it should be noted that the external surface of the projecting portion 24A and the internal surface of the recessed portion 28A will each have a refreshed metallic substrate surface thereof exposed, with both such metallic substrate surfaces mutually developing a dragging action which will join them with an extremely enhanced tightness. Thus, it will be apparent that both the thermal conductivity and the electrical conductivity will, as they are so joined together, be greatly enhanced at their joined interface.

The state in which the projecting portion 24A and the the recessed portion 28A have been joined together after the pressure insertion is shown in FIG. 8(D) where it will be seen that the joining between the projecting portion 24A and the recessed portion 28A will assume a joining state that is achieved primarily by the dragging action. In addition, since the fittedly enterring projecting portion 24A is designed to be sized slightly greater than the fittedly receiving recessed portion 28A and yet since the recessed portion 28A is provided with a portion that is inclined with a given angle relative to a direction perpendicular to the joining surface while the projection portion 24A is not angled relative to the direction of the insertion, it can be seen that an internal stress will be generated, in the directions of the arrows shown, by a contraction and an expansion, respectively, of the metallic projecting portion 24A and the metallic recessed portion 28A when the former is fittedly inserted into the latter and a stress will also be generated owing to the fact that the direction of the insertion is not altered while the fitted insertion is being carried out, these stresses being summed up to further enhance the tightness of fastening.

Accordingly, even in a case where the oxide film formed on each on the projecting portion 24A and the recessed portion 28A is so thick that a sufficient dragging state may not develop, it can also be seen that a stress created across the joining surfaces by the pressure applied will give rise to an enhancement of the thermal conductivity between the joined surfaces.

As set forth in the foregoing, it will be understood that the tight fastening between the projecting portion 24A and the recessed portion 28A is accomplished, primarily, by:
(1) a work hardening that is created due to the pressure insertion; and
(2) a stress that is created by angling a hardened metallic body, but, partially, by:
(1) a work hardening and a dragging action that are created in a combination at the time of the pressure insertion; and
(2) a spring force that is created due to the fact that a portion which has undergone a work hardening and has been hardened is bent in an internal angled surface portion of a recessed portion: and that these effects are particularly pronounced for a material that is ductile, such as an aluminum or copper material.

On the other hand, it will be apparent that the joining relationship between the projecting portion 24B, 24C, 24D and the recessed portion 28B, 28C, 28D is identical to the joining relationship between the projecting portion 24A and the recessed portion 28A as mentioned above.

Therefore, it follows that the heat that is produced from the heat generating element attached to the base plates 23 and 27 will be thermally conducted via the base plates 23 and 27 which have been so joined as to have an excellent thermal conductivity as mentioned above to the plurality of fin means 222 and the plurality of fin means 62, respectively, with these fins 22 and 26 acting to take away the heat conducted from the base plates 23 and 27 with an air flow from a fan or fans (not shown) attached to the heat sinks 21 and 25.

In connection with the above, it should also be noted that the respective side surfaces 23c and 27c of the two base plates 23 and 27 may be identical in thickness to their other other side surfaces 23d and 27d and may then be formed with a plurality of projecting portions and a plurality of recessed portions, respectively, as mentioned above. If, however, the side surfaces 23c and 27c are made greater in width than the side surfaces 3d and 7d as indicated above, and further the number of projecting portions and the number of recessed portions are increased, it can be seen that the tightness of fastening the base plates 23 and 27 together will further be enhanced.

It should further be noted that while the projecting portions 24A, 24B, 24C and 24D are shown as formed each to have a rounded forward end, they may either entirely or partly be formed with a wedge shaped forward end that is tapered forwards.

Figure 8A:
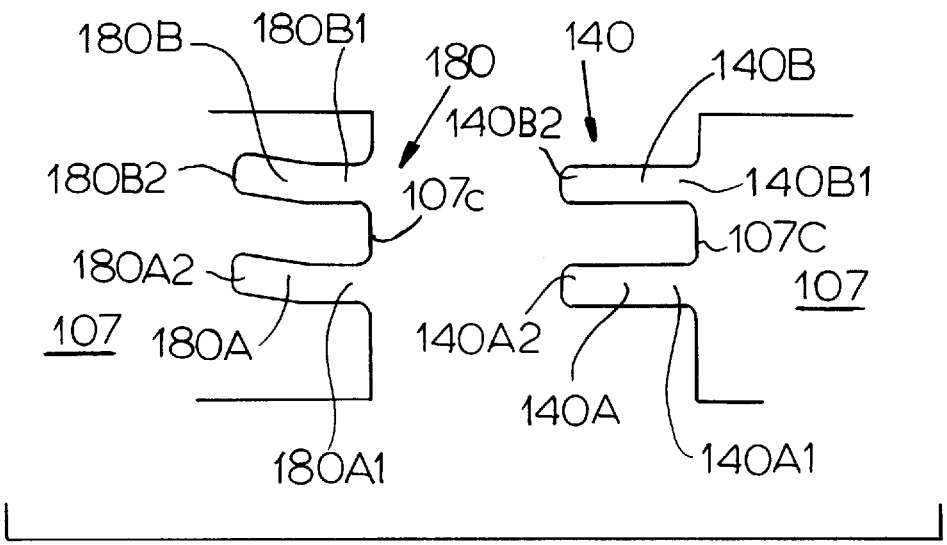
FIG. 8(A) is a still further enlarged partial view illustrating a certain form of the combination of two projecting portions and two recessed portions to be fastened, respectively, according to the present invention.
Figure 8B:
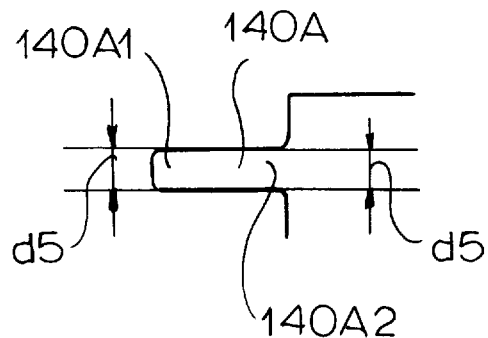
FIG. 8(B) is an enlarged view in detail illustrating diagrammatically a projecting portion in an example as shown in FIG. 8(A)
Figure 8C:
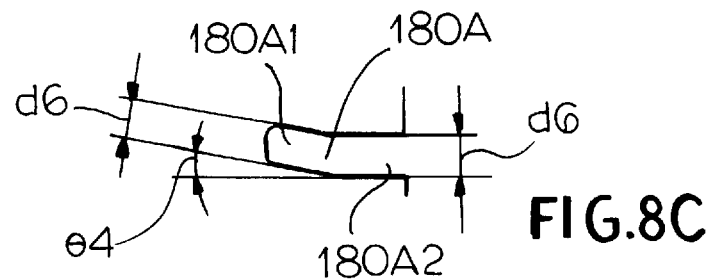
FIG. 8(C) is an enlarged view in detail illustrating diagrammatically a recessed portion in an example as shown in FIG. 8(A)

Next, FIGS. 8(A), 8(B) and 8(C) show a modified embodiment of a plurality of projecting portions and a plurality of recessed portions formed in a pair of base plates, respectively, or a pair of fin means and a base plate, respectively, for a heat sink assembly or unit to which the present invention has been applied.

Here, a joining structure 107 for joining together a pair of base plates or a pair of fin means and a base plate for a heat sink assembly or unit is constructed, in accordance with the present invention, from a plurality of projecting portions 140 of which a pair of projecting portions 140A and 140B are shown and a plurality of recessed portions 180 of which a pair of recessed portions 180A and 180B are shown. Here, the projecting portions 140A and 140B are each shown as having a given width d5 and are each constructed with a caulking portion 140A1, 140B1 that projects from a joining surface 107C in a direction perpendicular thereto and a positioning portion 140A2, 140B2 that further extends from the caulking portions 140A1, 140B1, with the positioning portion 140A2, 140B2 being formed to have a rounded forward end.

On the other hand, the recessed portions 180A and 180B are each shown as having a given width d6 and are each constructed with a positioning portion 180A1, 180B1, that is formed to extend in a direction perpendicular to the joining surface 107c and a caulking portion 180A2, 180B2 that further extends from the positioning portion 180A1, 180B1 while being slightly inclined with an angle θ 4 with respect to the direction perpendicular to the joining surface 107c, with the caulking portion 180A2, 180B2 having a bottom portion that is so rounded as to conform to the rounded forward end of the positioning portion 140A2, 140B2 of the projecting portion 40A, 40B. The width d6 of each recessed portion 180 is sized to be identical to, or slightly smaller than, the width d5 of each projecting portion 140.

Both the positioning portion 140A1, 140B2 of the projecting portion 140A, 140B and the positioning portion 180A1, 180B1 of the recessed portion 180A, 180B have their role to hold their perpendicularity to the joining surfaces 107c when the base plates 23 and 27 or the fin means 21, 26 and the base plate 23, 27 are fittedly inserted into each other, in order that the pressure applied when they are pressure inserted into each other may, without fail, be converted into a force of the fastening between them.

In the construction that is shown FIGS. 8(A), 8(B) and 8(C), if the projecting portions 140 are pressure inserted into the respectively corresponding recessed portions 180 under a large pressure, it can be seen that since the width d5 of each projecting portion 140 is made identical to, or slightly greater than, the width d6 of each recessed portion 180 with their size tolerance taken into account as mentioned above, a friction will develop between the external surface of each projecting portion 140 and the internal surface of each recessed portion 180 while providing a dragging action as mentioned above. It can be seen that the dragging action will serve to scrape away an oxide film as formed on the external surface of each projecting portion 140 and an oxide film as formed on the internal surface of each recessed portion 180, thus having a substrate surface of each projecting portion 140 and a substrate surface of each recessed portion 180 exposed as a refreshed external surface of each projecting portion 140 and a refreshed internal surface of each recessed portion 180, respectively. As a result of such an action, it can thus be seen that an extremely tightened joining state will be established each between the positioning portion 140A2, 140B2 of the projecting portion 140A, 140B and the caulking portion 180A2, 180B2 of the recessed portion 180A, 180B and between the positioning portion 180A1, 180B1 of the recessed portion 180A, 180B and the caulking position 140A1, 140B1 of the projecting portion 140A, 140B. Therefore, it follows that both the thermal conductivity and the electrical conductivity of the joining structure 107 will be greatly enhanced.

Also, after the pressure insertion has been carried out, it can be seen that since the positioning portion 140A1, 140B of the projecting portion 140A, 140B has forcibly been bent with the angle θ 4 along the caulking portion 180A2, 180B2 of the recessed portion 180A, 180B with respect to the direction perpendicular to the joining surface 107c, a tightened joining structure 107 will have been established with a greater certainty.

In connection with the foregoing, it may also be noted that in a case where the fin means 22, 26 and base plates 23 and 27 are each constituted by an extruded material, a size tolerance will have been imparted to these plates as a result of the extrusion unlike a case where they are each constituted by a cut material and that such a size tolerance might render the dragging of the base plates 3 and 7 and the fin means 22, 26 insufficient and hence might give rise to the development of a place where an oxide film as formed on the external surface of each projecting portion and an oxide film as formed on the internal surface of each recessed portion are not fully scraped away. Nevertheless, it should be noted that such a portion as is forcibly bent will be plastically deformed to bring about a work hardening thereof, which serves to increase the force of joining the two members together, thereby enhancing the thermal conductivity at the joined interface between them. Stated in other words, it can be noted that the said portion will play a role of compensating for the inconsistency in performance of products, i.e. from one heat sink to another that may arise from the inconsistency in size of products, i.e. from one product to another, as have been extruded.

In this way, it has now become apparent that the two members of a high thermal conductivity will be joined together at their respective projecting and recessed portions primarily by both the dragging action and the work hardening which would take place there and that even in a case where each oxide film is so thick that a sufficient dragging state may not be brought about, the thermal conductivity at their interface can still be enhanced by means of a stress as mentioned above which would be created by the pressure applied.

Still more, it should be noted that while the projecting portions 140 are each shown as having a rounded forward end, they may wholly or in part be formed each with a wedge shaped forward end.

According to the present invention, a pair of members each having a high thermal conductivity is joined together, without requiring a brazing facility and an expensive dedicated machine having the ability to caulk but by using only a general purpose hydraulic press and a simple jig in a combination, to yield an excellently joined product having a superior thermal conductivity.

Also, according to the present invention, when the respective joining surfaces of a pair of such members, e.g. excluded metallic materials, are fitted with each other, there doest it result that they are intensively abraded mutually to the extent that an oxide film as formed of each of the joining surfaces are scraped away to allow a refreshed substrate surface of one of the joining surfaces and a refreshed substrate surface of the other to be exposed, with the refreshed substrate surfaces being subjected to a dragging action so as to be brought into a tightly joined state, thereby enhancing the thermal conductivity at the joined interface.

Also, with the extruding technique and the heat treatment step required taken into consideration, even in a variety of preliminarily varied situations including a case where an oxide firm as formed is so thick that a fully refreshed substrate surface may not develop, or a case where the precision of the extrusion required may be varied more or less, it will now become apparent that the present invention enables a pair of members as described to be joined together with a greater certainty.

While the present invention has hereinbefore been described with respect to certain illustrative embodiments thereof, it will readily be appreciated by a person skilled in the art to be obvious that many alterations thereof, omissions therefrom and additions thereto can be made without departing from the essence and the scope of the present invention. Accordingly, it should be understood that the present invention is not limited to the specific embodiments thereof set out above, but includes all possible embodiments thereof that can be made within the scope with respect to the features specifically set forth in the appended claims and encompasses all equivalents thereof.

What is claimed is:

1. A method of joining a pair of thermally conductive members together, comprising the steps of:
   (a) extruding a first member of a metal having a high thermal conductivity so as to have a joining surface thereof formed with a recess extending generally perpendicular to said joining surface, and
   (b) extruding a second member of a metal of high thermal conductivity so as to have a joining surface thereof formed with a projection extending generally perpendicular to said joining surfaces and being configured to correspond to and to be substantially similar in shape to said recess,
   said projection having a width not less than that of said recess, at least one of said projection and said recess having at least a portion thereof inclined with an angle to the perpendicular to said surfaces; and (c) forcibly inserting said projection under pressure into said recess, wherein in steps (a) and (b) said projection and said recess are so formed, and in step (c) said projection is so forcibly inserted into said recess, as in step (c)

1) to cause areas of said projection and said recess with said portion inclined to be dynamically affected under pressure and thereby plastically deformed to effect a work hardening thereof, 2) to develop an internal stress in said areas from a contraction and expansion of said projection entering and said recess receiving when driven together under pressure, and 3) to induce a caulking action in said areas from said stress developed and a frictional force dynamically produced between said entering projection and receiving recess with said portion inclined, thereby fastening tightly and thus joining said two members together under a combined effect of said work hardening, said internal stress developed and said caulking action induced.

2. The method of joining together a pair of members each having a high thermal conductivity, as set forth in claim 1, in which said pair of thermally high conductivity members are each constituted by a base plate for a heat sink assembly.

3. The method of joining together a pair of members each having a high thermal conductivity, as set forth in claim 1, in which said two thermally conductivity members are constituted by a base plate and fin means, respectively, for a heat sink assembly.

4. A method of joining a pair of thermally conductive members together, comprising the steps of:

(a) extruding a first member of a metal having a high thermal conductivity so as to have a joining surface thereof formed with at least one of recesses and projections extending generally perpendicular to said joining surface, which if singular has, and if plural include at least some each having, at least a portion thereof inclined with an angle to the perpendicular to said joining surface, and (b) extruding a second member of a metal of high thermal conductivity so as to have a joining surface thereof formed with at least one of projections and recesses extending generally perpendicular to said joining surfaces and being configured to correspond to and to be essentially similar in shape to said at least one of recesses and projections, a said projection of one of said first and second members having a width not less than that of a said recess of the other of said first and second members; and (c) forcibly inserting under a pressure said at least one projection into said at least one recess corresponding thereto, wherein in steps (a) and (b) said at least one projection and said at least one recess are so formed, and in step (c) said at least one projection is so forcibly inserted into said at least one recess, as in step (c)

1) to cause areas of said at least one projection and said at least one recess with said portion inclined to be dynamically affected under pressure and thereby plastically deformed to effect a work hardening thereof, 2) to develop an internal stress in said areas from a contraction and expansion of said at least one projection entering and said at least one recess receiving when driven together under pressure, and 3) to induce a caulking action in said areas from said stress developed and a frictional force dynamically produced between said entering at least one projection and receiving at least one recess with said portion inclined, thereby fastening tightly and thus joining said members together under a combined effect of said work hardening, said internal stress developed and said caulking action induced.

5. The method of joining together a pair of members each having a high thermal conductivity, as set forth in claim 4, in which said pair of thermally high conductivity members are each constituted by a base plate for a heat sink assembly.

6. The method of joining together a pair of members each having a high thermal conductivity, as set forth in claim 4, in which said two thermally conductivity members are constituted by a base plate and fin means, respectively, for a heat sink assembly.

* * * * *

UNITED STATES PATENT AND TRADEMARK OFFICE
CERTIFICATE OF CORRECTION

PATENT NO. : 5,819,407
DATED : 13 October 1998
INVENTOR(S) : Atsushi TERADA

It is certified that error appears in the above-identified patent and that said Letters Patent is hereby corrected as shown below:

On the title page, :

Item [73] For Assignee: Tousui, Ltd., Totte, Japan :

to read

Item [73] Assignee: Tousui, Ltd., Toride, Japan --.

Signed and Sealed this

Thirteenth Day of July, 1999

Attest:

Q. TODD DICKINSON

*Attesting Officer*    *Acting Commissioner of Patents and Trademarks*